(12) United States Patent
Park (10) Patent No.: US 6,466,478 B1
(45) Date of Patent: Oct. 15, 2002

(54) NON-VOLATILE SEMICONDUCTOR MEMORY DEVICE (75) Inventor: Dong-Ho Park, Kyunggi-do (KR)

(73) Assignee: Samsung Electronics Co., Ltd., Hwasung (KR)

(*) Notice: Subject to any disclaimer, the term of this patent is extended or adjusted under 35 U.S.C. 154(b) by 0 days.

(21) Appl. No.: 09/847,115

(22) Filed: May 1, 2001

(30) Foreign Application Priority Data

Dec. 14, 2000 (KR) .......................................... 2000-76377

(51) Int. Cl.[7] .............................................. G11C 16/04
(52) U.S. Cl. .............................. 365/185.11; 365/185.13; 365/185.23; 365/185.29
(58) Field of Search ........................ 365/185.11, 185.13, 365/185.23, 185.29, 185.01

(56) References Cited

U.S. PATENT DOCUMENTS 5,621,690 A * 4/1997 Jungroth et al. ....... 365/185.09
5,808,945 A * 9/1998 Arase ........................ 365/200
2001/0001263 A1 * 5/2001 Guliani et al .......... 365/230.03

* cited by examiner

*Primary Examiner*—Hoai Ho
(74) *Attorney, Agent, or Firm*—Marger Johnson & McCollom, P.C.

(57) ABSTRACT

A NOR-type flash memory device includes a global decoder circuit that is coupled to global wordlines. The global decoder circuit drives the global wordlines using wordline voltages that will be applied to local wordlines in each operation mode, and has wordline select switches each corresponding to the global wordlines. A local decoder circuit couples the local wordlines to the global wordlines in response to a sector select signal, and a sector generates a control signal in accordance with address information for selecting a memory cell array. A switch circuit includes a plurality of depletion MOS transistors each being coupled between corresponding first and second wordline. The depletion MOS transistors are commonly controlled by a control signal. Each of the wordline select switches is made of two NMOS transistors.

7 Claims, 8 Drawing Sheets

(Prior Art)

(Prior Art)

NON-VOLATILE SEMICONDUCTOR MEMORY DEVICE

This application relies for priority upon Korean Patent Application No. 2000-76377, filed on Dec. 14, 2000, the contents of which are herein incorporated by reference in their entirety.

FIELD OF THE INVENTION

The present invention relates to a non-volatile semiconductor memory device and, more particularly, to a flash memory device with NOR-type memory cells.

BACKGROUND OF THE INVENTION

In speed of program and read operations, a NOR-type flash memory is far superior to electrically programmable and erasable non-volatile semiconductor memory device. Therefore, the NOR-type flash memory has been garnering warm response from users that require faster operation speed.

Figure 1:
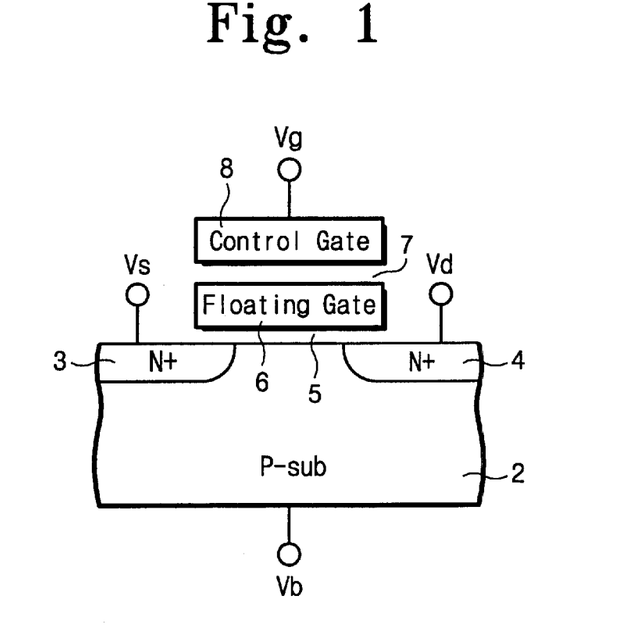
FIG. 1 is a cross-sectional view showing a structure of an electrically erasable and programmable memory cell.

FIG. 1 shows a construction of a flash EEPROM cell. An N-type source region 3 and an N-type drain region 4 are formed on a P-type substrate or a bulk region 2 with a channel region interposed therebetween. A floating gate 6, which is insulated by an insulating layer 5 of 100 Å A or less, is formed on the P-type channel region. A control gate 8, which is insulated by another insulating layer 7, is formed on the floating gate 6.

Figure 2:
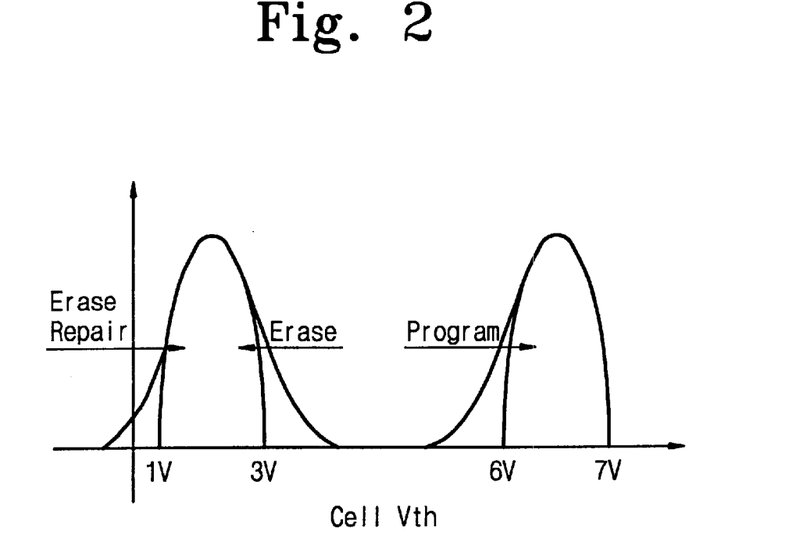
FIG. 2 is a graph showing threshold voltages distributions corresponding to erase and program states.

Channel hot electrons are injected into a floating gate from a channel region adjacent to a drain region, programming an EEPROM cell. The hot electron injection is carried out by grounding a source region and a P-type bulk region, applying a high voltage (e.g., +10V) to a control gate, and applying a voltage (e.g., 5V–6V) fitted for creation of hot electrons to the drain region 4. If negative charges (injected hot electrons) are sufficiently accumulated to a floating gate, the floating gate has a negative potential, boosting up a threshold voltage in a sequential read operation. The reading operation is carried out by applying a suitable voltage (e.g., 1V) to a drain region, applying an optimum voltage (to distinguish an erased cell from a programmed cell) of 4.5V to the control gate, and applying a voltage of 0V to a source region and the P-type substrate. A threshold voltage distribution of the programmed cell generally has a range of 6V–7V, as shown in FIG. 2. In the P-type substrate that is electrically separated from a floating gate by an insulating layer, a channel is not created. Accordingly, the memory cell is read out as logic "OFF state".

F-N (Fowler-Nordheim) tunneling is made from a floating gate to a bulk (P-type substrate), erasing the EEPROM cell. A conventional tunneling manner is performed by applying a negative high voltage (e.g., −10V) to an electrode of the control gate and applying a suitable positive voltage (e.g., +5V) to the bulk region. In this case, the drain region holds a high impedance state or a floating state in order to maximize an erase effect. Due to such a manner, a strong electric field is created between the control gate and the bulk region. The F-N tunneling is made then, discharging negative charges in the floating gate to the source (or bulk). Generally, when an electric field of 6–7MV/cm is created across an insulating layer, the F-N tunneling is made. A thin insulating layer of 100Å or less is formed between the floating gate and bulk region, making the F-N tunneling. A threshold voltage distribution of the erased cell generally has a voltage range of 1V–3V, as shown in FIG. 2. In the reading operation, a channel is created in the P-type substrate that is electrically separated from a floating gate by an insulating layer. Accordingly, the memory cell is read out as logic "ON state".

When a memory cell array is constructed using the EEPROM cells, bulk regions of the cells are coupled to each other in order to achieve high integration. This causes a plurality of EEPROM cells sharing a bulk to be erased at the same time in the erasing operation. In this case, a region being an elementary unit of erasure is called a "block" or a "sector". Voltages each being applied to a terminal in reading and erasing operations is illustrated in the following [TABLE 1]. And, a distribution of cell threshold voltages after programming and erasing operations is shown in FIG. 2.

TABLE 1

| Operation Mode | Vg | Vd | Vs | Vb |
|---|---|---|---|---|
| Programming | +10 V | +5 V~+6 V | 0 V | 0 V |
| Erasing | −10 V | floating | floating | +5 V |
| Reading | +4.5 V | +1 V | 0 V | 0 V |

Figure 3:
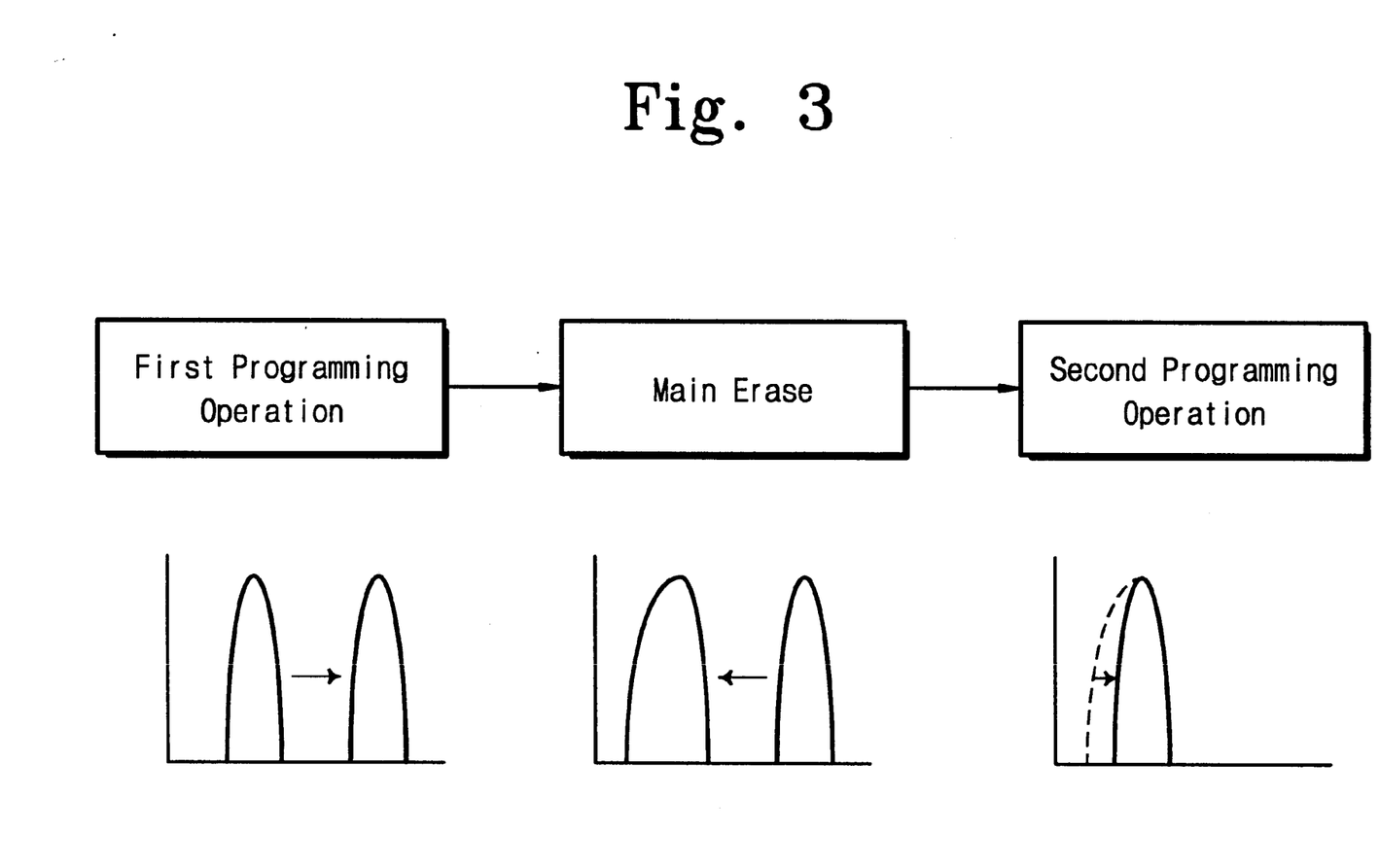
FIG. 3 is a diagram showing a conventional erase algorithm.

In a semiconductor memory device using NOR-type flash memory cells, programming and erasing operations are carried out by a command that is applied from an exterior of a chip. At this time, a verifying operation is carried out by an internal algorithm so that programmed or erased cell can have target program or erase threshold voltage distribution. If a cell is under or over a target threshold voltage, the cell is subject to a re-programming operation and a re-erasing or over-erase repair post-programming operation. An embedded algorithm for erasing a sector is classified into three parts that are a pre-programming algorithm as a first programming operation, a main erasing algorithm, and a post-programming algorithm as a second programming operation, as shown in FIG. 3.

The embedded algorithm proceeds, as follows. In order to collect a threshold voltage distribution of an erased cell, all cells in a corresponding sector are sequentially programmed in the first programming operation to situate a threshold voltage of all cells in a sector, which will be erased, to a constant level (e.g., 7V or higher). A constant negative voltage (e.g., −10V) is then applied to all wordlines in the sector, erasing the cells at the same time as the main erasing operation. In this case, a constant positive voltage (e.g., 5V) is applied to not only a bulk of the corresponding sector but also a bulk of a cell in a redundancy field, erasing the cell at the same time as the cells in a main field. After the erasing operation, over-erased cells are detected to carry out a programming operation as the second programming operation for boosting up a voltage level thereof to a constant threshold voltage (e.g., 1V or higher) or higher.

Generally, a cell array of a NOR-type flash memory device is composed of redundancy fields for repairing cells whose programming and erasing operations are failed by hard defect and soft defect that occur in a main field and its cell array. In this case, a repaired unit is composed of row or wordline units or column or bitline units according to a core structure.

Cells causing a fail in a main field, which will hereinafter referred to as "defect cells", are repaired by cells in a redundancy field, hereinafter referred to as "redundant cells". In spite of the repair, the defect cells still remain in the main field, having an influence on operations of a memory device. In case of a wordline-related fail such as a wordline to bitline short, when a switch to decode a wordline is made using PMOS and NMOS transistors, a positive high voltage applied to a bulk during the erasing operation is equivalently applied to a gate. Thus, a voltage applied toward a drain of a PMOS transistor used in a conventional decoder is higher than that of a bulk in the PMOS transistor. A forward bias is then applied to a P-N junction. If a wordline is electrically connected to a bulk, the forward bias is also applied to a PMOS transistor junction used in a decoder. Accordingly, a wordline repair operation cannot be carried out in such a structure with an erasing operation is carried out by applying a bias to a bulk. This will be explained later in detail.

Figure 4:
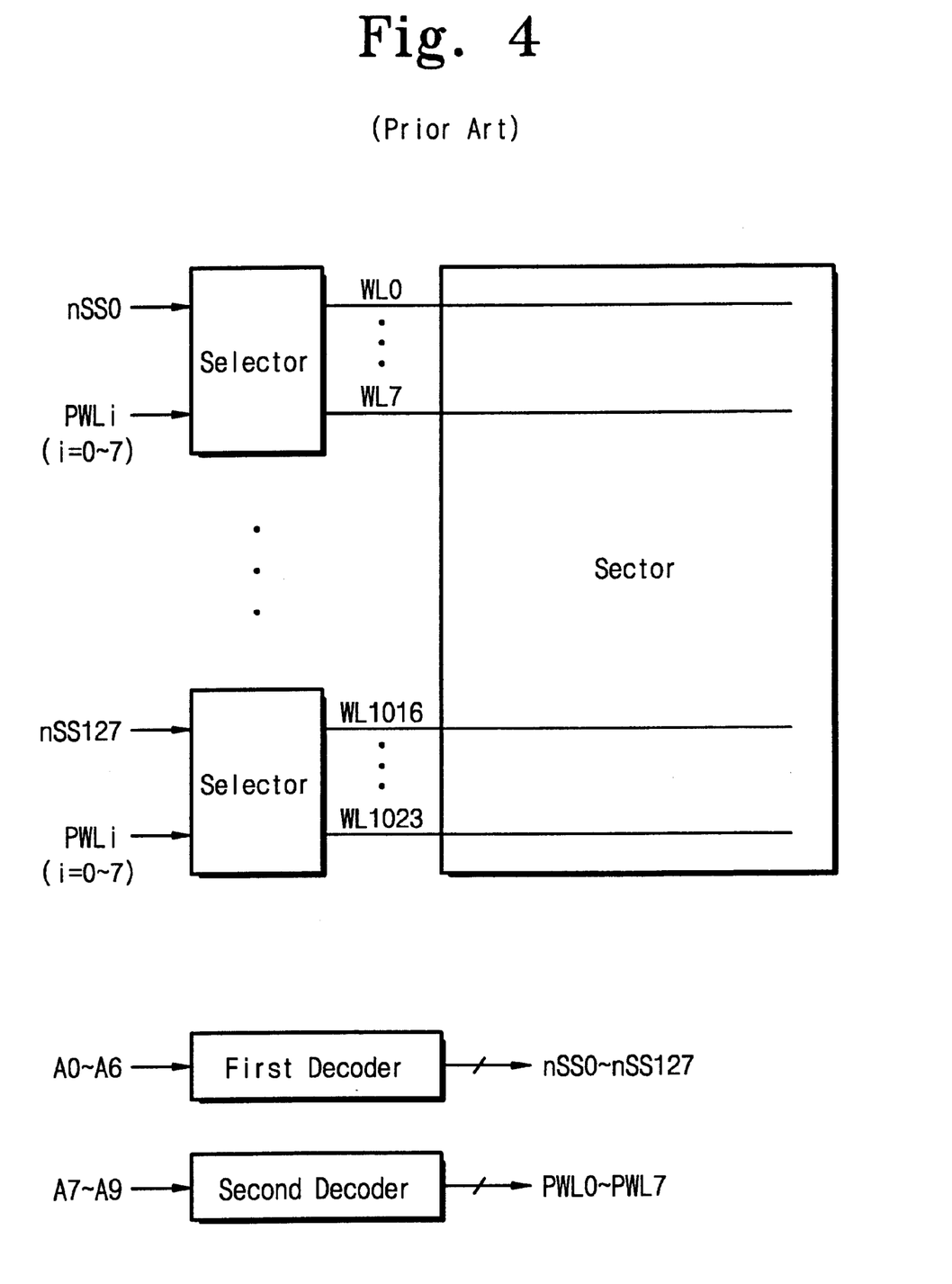
FIG. 4 is a block diagram showing a NOR-type flash memory device in accordance with a prior aft.
Figure 5:
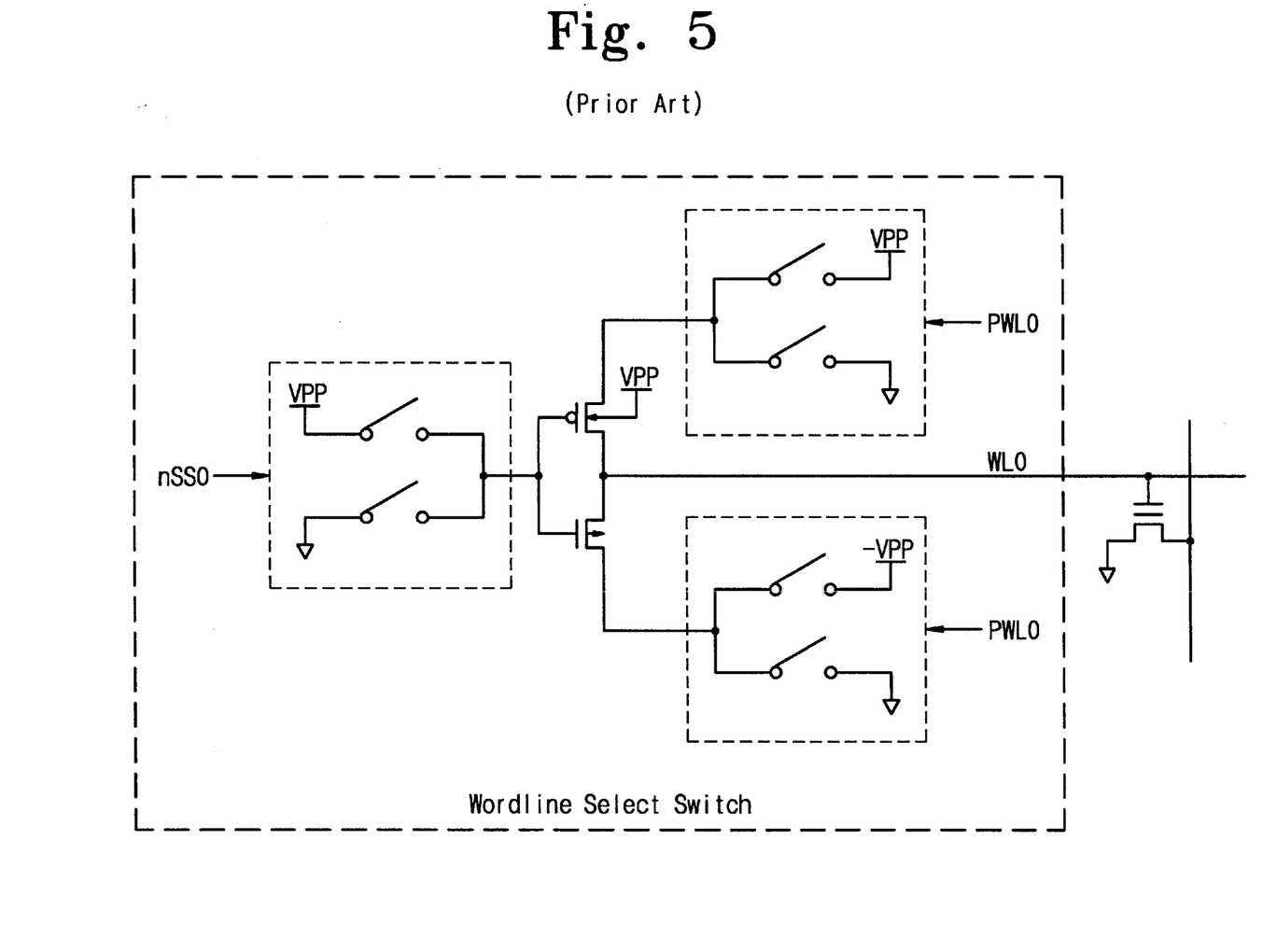
FIG. 5 is a circuit diagram showing a wordline select switch in accordance with a prior art.
Figure 6:
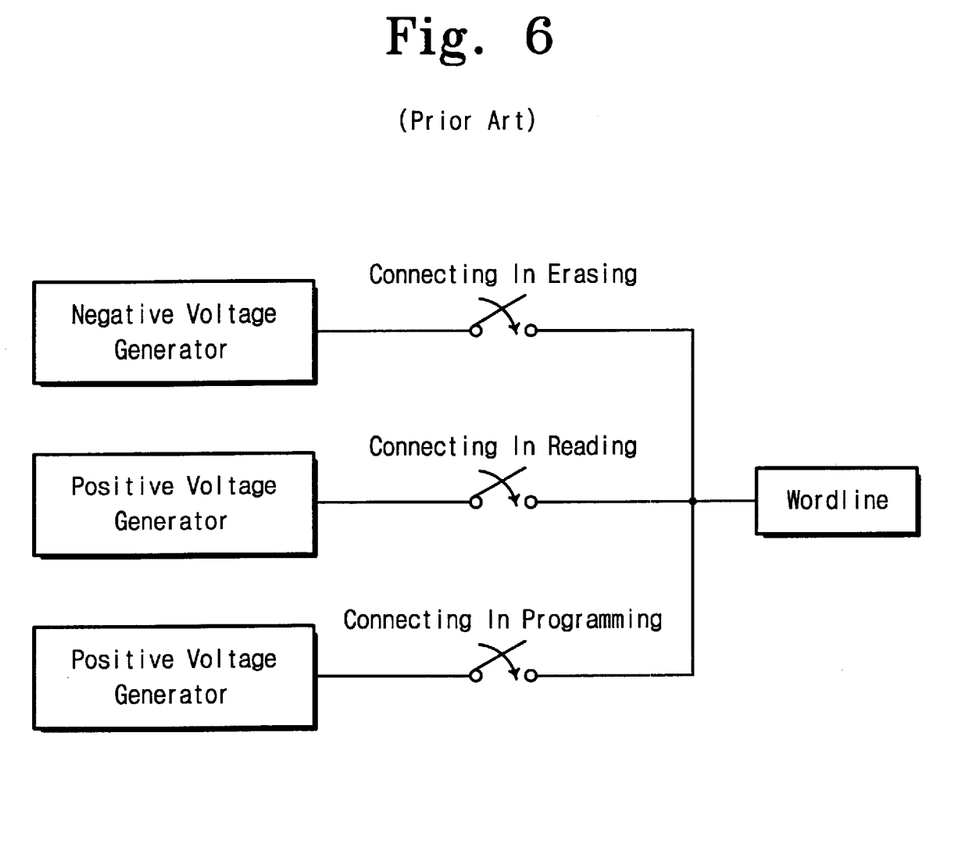
FIG. 6 is a diagram showing a flow to carry voltages required in each operation mode to a wordline in accordance with a prior art.

FIG. 4 schematically shows a 16M NOR-type flash memory device in accordance with a prior art. Also, FIG. 5 shows a wordline select signal in accordance with a prior art. In a 16M NOR-type flash memory device, to select one wordline during reading or programming operation, one sector is selected by a sector address. Generally, one sector has a storage capacity of 64 KB and is composed of 1024 wordlines and 512 bitlines. To decode 1024 wordlines after selecting one sector, conceptually, a 10-bit address is required. The 10-bit address is divided into a first address A0–A6 and a second address A7–A9, which are composed of seven address bits and three address bits, respectively.

Based on the first address, one of first select signals nSSi (i=0–127) for each selecting 128 selectors is activated. Also, based on the second address, one of second select signals PWLj (j=0–7) for selecting one of eight wordlines each corresponding to selectors is activated. Only one wordline corresponding to the activated select signals is selected. Since a voltage higher than a power supply voltage must be applied to a wordline in programming or reading operation, a level shifter is required which can switch a high voltage while decoding the wordline. With a sector unit, all cells of 64 KB are subject to the erasing operation at the same. Accordingly, a negative voltage is applied to wordlines WL0–WL1023 of the whole sector. A wordline select switch circuit with a structure for applying positive and negative voltages according to each mode is shown in FIG. 5. The wordline select switch circuit transfers a positive voltage to a wordline selected in programming or reading operation, or transfers a negative voltage to a wordline selected in an erasing operation.

If a wordline-related defect occurs in a memory array with such a structure, cells in a main field are repaired by cells in a redundancy cell. In other words, if an address is applied for externally accessing to a cell that adheres to a defect wordline, an internal logic circuit checks whether a wordline corresponding to the applied address is repaired. If it is then verified that the wordline is repaired, a redundant cell is applied by the address instead of a main cell. And then, all voltage conditions applied to the main cell are identically applied to cells in the redundancy field. In FIG. 5, a core uses a wordline select switch using both PMOS and NMOS transistors. When a wordlines is coupled to a bitline or a wordline is electrically coupled to a bulk, a positive voltage applied to the bulk in the erasing operation is applied to the wordline select switch. Due to the applied positive voltage, a forward bias is applied to a drain-bulk junction of a PMOS transistor in a wordline select switch where 0V is applied to a gate, a source, and a bulk in order to retain a turn-off state in the erasing operation. Thus, the device cannot be used.

To make matters worse, breakdown occurs between a bulk-drain junction and a bulk-source junction of an NMOS transistor in a wordline select switch for applying a negative voltage to a gate. More specifically, in case of wordline-bitline connection, a positive high voltage applied to a bulk in an erasing operation is boosted as much as a built-in voltage. The boosted voltage is applied to a bitline and a wordline, respectively. A voltage on a wordline is applied to a drain of the NMOS transistor, causing a breakdown between bulk-drain junctions of an NMOS transistor to which a negative voltage is applied. Thus, the device cannot be used. Such a problem is inevitable because a negative voltage is equivalently applied to a well of an NMOS transistor in order to form an NMOS switch to carry the negative voltage, and a breakdown voltage of a pocket P-well structure separated from an essential P-type semiconductor substrate is low due to a high concentration of a pocket P-well area.

In order to solve the foregoing problems, the present invention provides a non-volatile semiconductor memory device with a wordline select switch that is composed only using an NMOS transistor. The memory device with the wordline select switch can repair defects such as wordline-bitline connection, wordline-bulk connection, and wordline-wordline connection.

SUMMARY OF THE INVENTION

In accordance with the invention, a non-volatile semiconductor memory device is made of memory cell arrays each including a plurality of local wordlines, a plurality of bitlines, and a plurality of flash EEPROM cells located at intersections of the plural wordlines and bitlines. A plurality of global wordlines is arranged through the memory cell array, each corresponding to the local wordlines. A global decoder circuit is coupled to the global wordlines. The global decoder circuit drives the global wordlines using wordline voltages that will be applied to the local wordlines, and have wordline select switches each corresponding to the global wordlines. A local decoder circuit couples the local wordlines to the global wordlines in response to a sector select circuit. The global decoder circuit generates a control signal, based upon address information for selecting the memory cell array. A switch circuit includes a plurality of depletion MOS transistors each being coupled between corresponding first and second wordlines. The plural depletion MOS transistors are commonly controlled by the control signal. Each of the wordline select switches is made of two MOS transistors.

BRIEF DESCRIPTION OF THE DRAWINGS

The present invention will be understood and appreciated more fully from the following detail description taken in conjunction with the drawings in which.

DESCRIPTION OF THE PREFERRED EMBODIMENT

Figure 7:
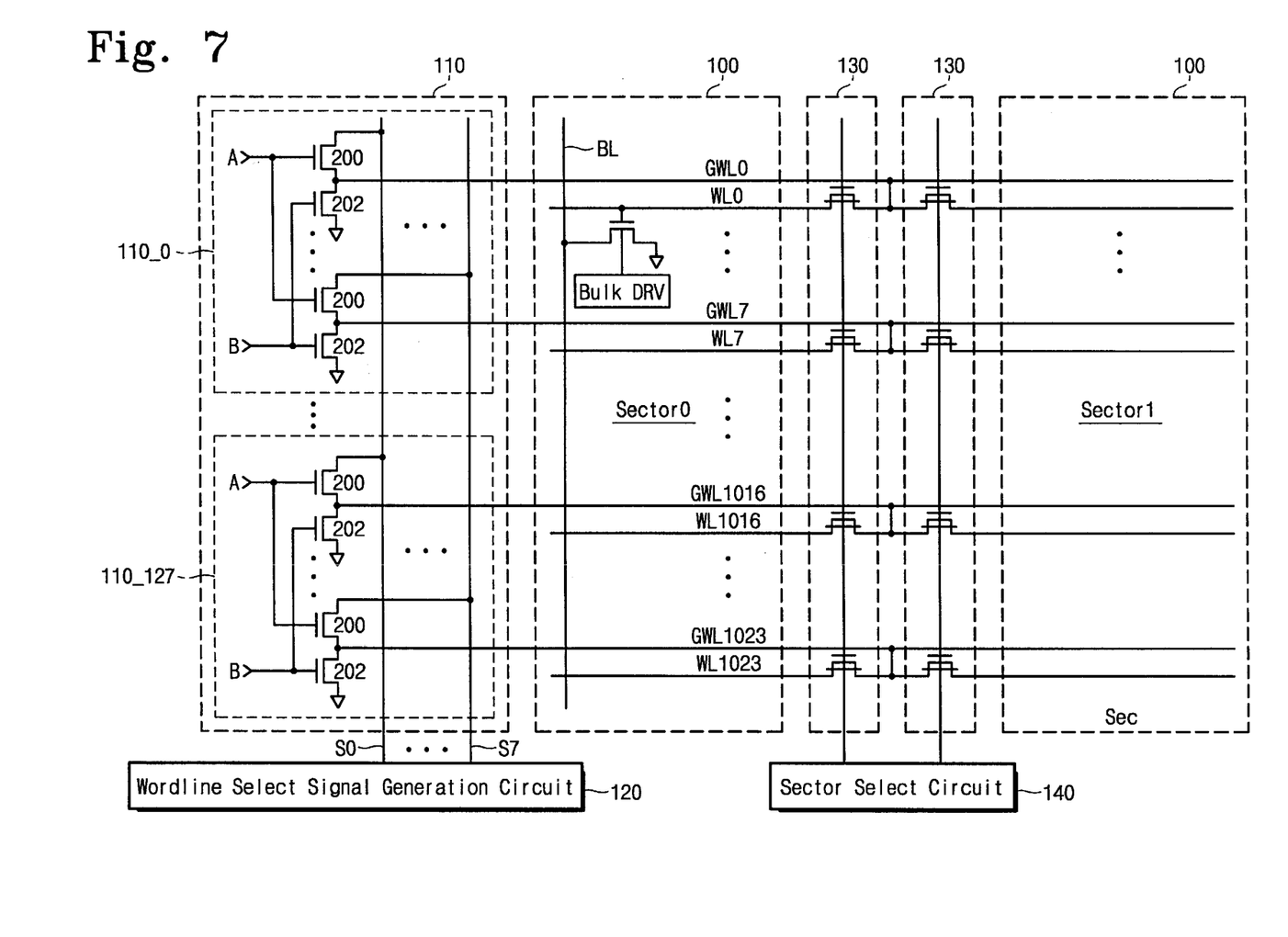
FIG. 7 is a block diagram showing a NOR-type flash memory device in accordance with the present invention.

Reference is now made to FIG. 7, which schematically illustrates a structure of a NOR-type flash memory device in accordance with the present invention. The NOR-type flash memory device includes a memory cell array. In this embodiment, the memory cell array is composed of two sectors 100. The NOR-type flash memory device further includes a global decoder circuit 110, a wordline selection signal generation circuit 120, local decoder circuits 130, and a sector selection circuit 140. 1K wordlines, hereinafter referred to as "local wordlines", WL0–WL1023 arranged at each sector 100 are divided into 128 wordline segments each being composed of eight local wordlines. Global wordlines GWL0–GWL1023 each corresponding to local wordlines are arranged to a direction same as the local wordlines, through the sectors 100. In other words, a ratio of the local wordlines to the global wordlines is one to one (1:1).

The global decoder circuit 110 is composed of select blocks 110_0–110_127 each corresponding to the wordline segments. As a wordline select switch, each of the select blocks 110_0–110_127 is composed of two NMOS transistors 200 and 202. A wordline select switch corresponding to a global wordline GWL0 is composed of, for example, a drain coupled to a line of a select signal S0 from the wordline select signal generation circuit 120, a first NMOS transistor 200 having a source coupled to a corresponding global wordline GWL0 and a coupled gate to receive a control signal A, a drain coupled to the global wordline GWL0, and a second NMOS transistor 202 having a grounded source and a coupled gate to receive a control signal B.

The first NMOS transistors 200 are commonly controlled by the corresponding control signal A, while the second NMOS transistors 202 are commonly controlled by the corresponding control signal B. As decoding results of address signals (e.g., A3–A9), the control signals A and B are generated from a predecoder circuit (not shown). Based on address signals A0–A2, the select signals S0–S7 are generated from the wordline select signal generation circuit.

Continuously referring to FIG. 7, each of the local decoder circuits 130 electrically connects local wordlines WL0–WL1023 to global wordlines GWL0–GWL1023 in a corresponding global wordlines under the control of a sector select circuit 140. Also, each of the circuits 130 is coupled between corresponding local wordlines and global wordlines and is composed of depletion MOS transistors that are commonly controlled by a sector select signal from the sector select circuit 140.

Now, operations of the memory device having such a structure will be described more fully hereinafter.

The following explanation is a procedure of selecting one local wordline in programming and reading operations. If one sector is composed of 1024 local wordlines, 128 wordline segments or units are divided by address decoding of address signals A3–A9, as a first address. One of eight global wordlines in the selected wordline segments is selected by address decoding of address signals A0–A2, as a second address. In order to select one global wordline, two NMOS transistors 200 and 202 are used. The underlying NMOS transistor 202 is used to ground an unselected global wordline.

To switch a positive high voltage using an NMOS transistor without lowering a signal voltage, a high voltage must be applied to a gate of the NMOS transistor. In this case, the applied voltage is higher than a voltage of a switching-required signal and a threshold voltage. For this, the gate is precharged and floated to a constant voltage. A positive voltage of a switching-required select signal is applied to a drain of the NMOS transistor, so that capacitive coupling occurs. Using the capacitive coupling, a structure of a self-boosting circuit is made to retain a gate voltage to a precharge level that is higher than a drain voltage. Accordingly, a wordline select switch can be made without using a PMOS transistor.

Finally, one local wordline is selected by the selected global wordline, a sector select circuit, and a local decoder circuit. The local decoder circuit for selecting a sector uses a depletion NMOS transistor in order to apply a high voltage applied from a global decoder circuit just to a local wordline. In an erasing operation, a high voltage of about 20V is applied to a divided bulk of each sector. Due to F-N tunneling effect, electrons of a floating gate are then transferred to a bulk.

Since the wordline select switch does not use a PMOS transistor, when a high voltage is applied from a sector failed by wordline-bitline connection to a bulk in an erasing operation, even though the high voltage is applied to a global wordline through a bitline, source-bulk and drain-bulk junctions of NMOS transistors are not forwardly biased. In a core structure using only NOMS transistors, to prevent a repaired wordline from having an influence upon operations of a normal wordline, there is a requisition for a circuit structure which can prohibit erasure of cells coupled to the repaired wordline in the erasing operation. A scheme to float a repaired wordline is applied to such a circuit structure. In an erasing operation, to float a repaired wordline, a power supply voltage (Vcc) of a select signal line is applied using wordline decoding information of a repaired wordline stored in, for example, a fuse box. Thus, the NMOS transistor for selecting a sector is shut off to float the repaired wordline.

Figure 8:
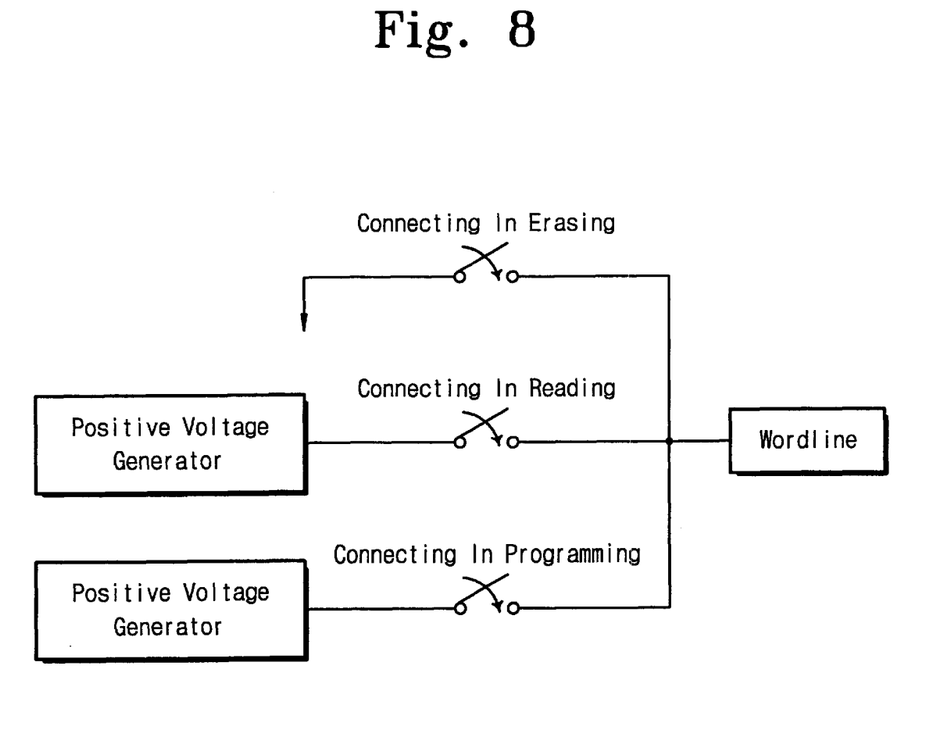
FIG. 8 is a diagram showing a flow to carry voltages required in each operation mode to a wordline in accordance with the present invention.
Figure 9:
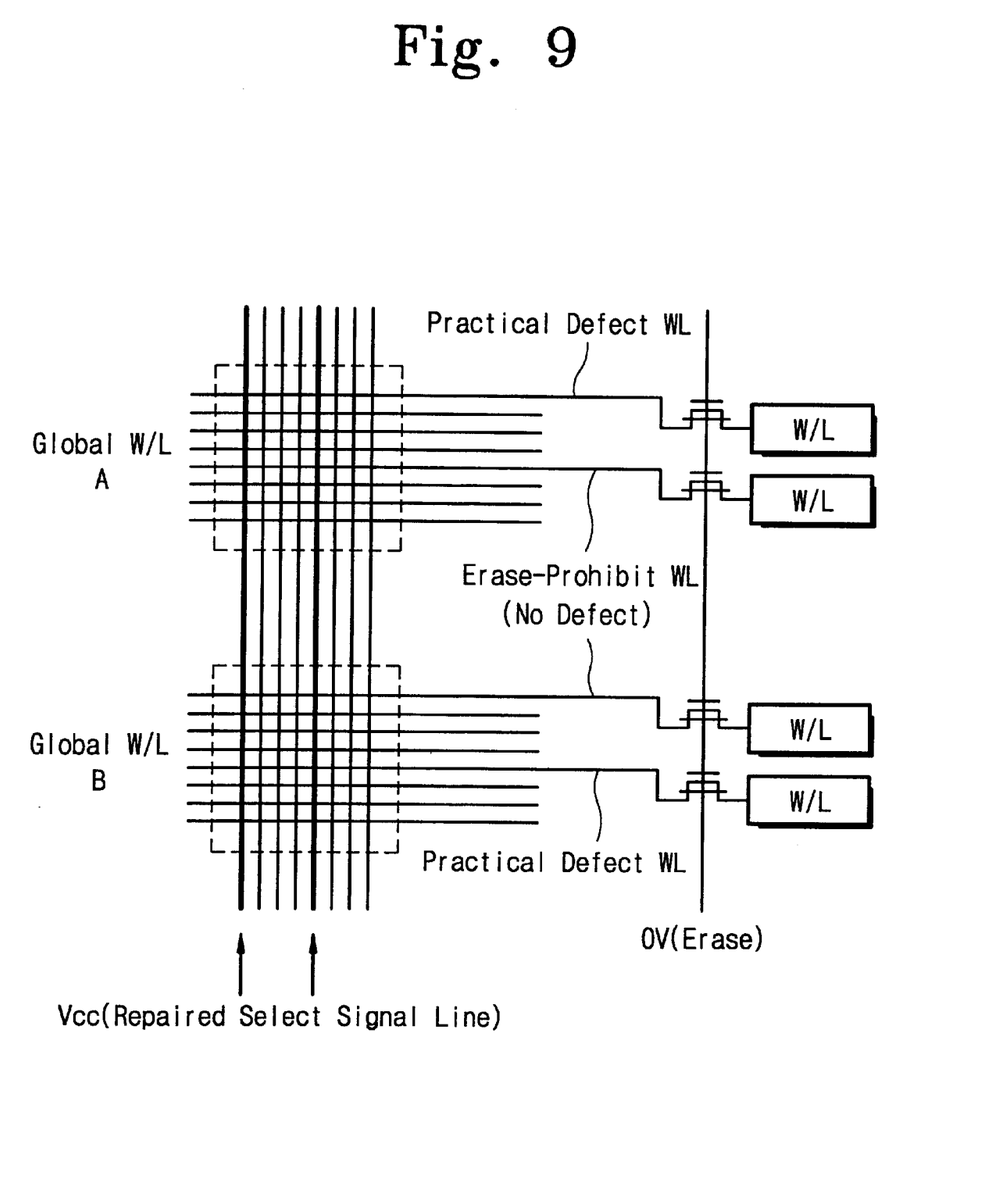
FIG. 9 is a diagram showing a relationship between repaired local wordlines and global wordlines in an erasing operation.

A wordline repair structure according to the invention will now be described more fully with reference to FIG. 8 and FIG. 9. If a wordline is failed, address information A3–A9 for selecting a wordline segment of the failed wordline and address information A0–A2 for generating select signals are stored in an address storage such as a fuse box. In accessing to the failed wordline, an address repaired in the wordline segment is controlled to be indicated. In an erasing operation, a decoding path of failed global wordlines is opened to apply a power supply voltage (Vcc) to a failed global wordline. The power supply voltage (Vcc) is applied to a select signal line of a practically failed wordline, prohibiting the erasing operation. Using such a structure, the power supply voltage (Vcc) is applied to not only a practically failed local wordline but also another select signal line of the failed global wordline (because a select signal line is commonly used by 1024 wordlines). As a result, erase-prohibit wordlines are made (in spite of no practical fail).

As described so far, a wordline select switch is constructed using only NMOS transistors, solving defects such as wordline-bitline connection, wordline-bulk connection, and wordline-wordline connection.

In the foregoing description, the invention has been described with reference to a specific exemplary embodiment thereof. It will, however, be evident that various modifications and changes may be made thereto without departing from the broader spirit or scope of the invention as defined in the appended claims. The specification and drawings are, accordingly, to be regarded in an illustrative rather than a restrictive manner.

What is claimed is:

1. A flash memory device comprising:
   a) a memory cell array having a plurality of local wordlines, a plurality of bitlines, and a plurality of flash EEPROM cells each being arranged at intersections of the plural local wordlines and bitlines;
   b) a plurality of global wordlines arranged through the memory cell array, each corresponding to the local wordlines;
   c) a global decoder circuit for driving the global wordlines using wordline voltages to be applied to the local wordline, the global decoder circuit being coupled to the global wordlines and having wordline select switches each corresponding to the global wordlines;
   d) a local decoder circuit for coupling the local wordlines to the global wordlines in response to a sector select signal;
   e) a sector select circuit for generating a control signal according to address information for selecting the memory cell array; and
   f) a switch circuit having a plurality of depletion MOS transistors each being coupled between corresponding first and second wordlines,
   g) wherein the plural depletion MOS transistors are commonly controlled by the control signal; and
   h) wherein each of the wordline select switches is made of two NMOS transistors.

2. The device as claimed in claim 1, wherein each of the depletion MOS transistors includes a depletion NMOS transistor having a negative threshold voltage.

3. The device as claimed in claim 1, wherein a first NMOS transistor of each of the wordline switch circuit includes a drain for receiving a select signal from a wordline select signal generation circuit, a source coupled to a corresponding global wordline, and a gate for receiving a first control signal, the gate being coupled to the first control signal; and
   a) wherein a second NMOS transistor of each of the wordline switch circuit includes a drain coupled to the corresponding global wordline, a grounded source, and a gate for receiving a second control signal, the gate being coupled to the second control signal.

4. The device as claimed in claim 3, wherein the first and second control signals are generated as decoding results of address information for selecting segments of the global wordlines.

5. The device as claimed in claim 3, wherein a select signal applied to a wordline select switch corresponding to repaired one of the local wordlines has a power supply voltage level.

6. The device as claimed in claim 1, wherein a ground voltage is applied to gates of the depletion NMOS transistors and a high voltage of 20V is applied to a bulk of the EEPROM cells, in an erasing operation.

7. The device as claimed in claim 3, wherein a power supply voltage is applied to the gate of the first NMOS transistor in the wordline select switch.

* * * * *